United States Patent
Chen

(10) Patent No.: US 7,423,478 B2
(45) Date of Patent: Sep. 9, 2008

(54) INPUT OFFSET VOLTAGE CORRECTOR

(75) Inventor: Chun-Hsiung Chen, Hsinchu (TW)

(73) Assignee: Holtek Semiconductor Inc., Hsinchu (TW)

( * ) Notice: Subject to any disclaimer, the term of this patent is extended or adjusted under 35 U.S.C. 154(b) by 87 days.

(21) Appl. No.: 11/512,293

(22) Filed: Aug. 30, 2006

(65) Prior Publication Data

US 2008/0054999 A1    Mar. 6, 2008

(51) Int. Cl.
*H03F 1/02*    (2006.01)
(52) U.S. Cl. .......................................... 330/9
(58) Field of Classification Search ............. 330/9; 327/124, 307
See application file for complete search history.

(56) References Cited

U.S. PATENT DOCUMENTS 6,653,893 B2 *    11/2003    Casper et al. .................. 330/9

* cited by examiner

*Primary Examiner*—Khanh V Nguyen
(74) *Attorney, Agent, or Firm*—Rosenberg, Klein & Lee

(57) ABSTRACT

An input offset voltage corrector used in an operational amplifier includes a switch unit, a register unit, an offset voltage correction unit and a micro control unit. The micro control unit sets the register unit to control the switch unit to switch the input offset voltage corrector to different operating modes. If an input offset voltage corrector is set to the offset voltage correcting mode, the offset voltage correction unit will adjust the input offset voltage of the operational amplifier to output an exact signal. Furthermore, the input offset voltage corrector can adjust the input offset voltage anytime according to the operating conditions to maintain the best characteristic of the operational amplifier.

19 Claims, 6 Drawing Sheets

INPUT OFFSET VOLTAGE CORRECTOR

BACKGROUND OF THE INVENTION

1. Field of the Invention

The present invention relates to an apparatus for correcting an input offset voltage, and more particularly to an input offset voltage corrector used for adjusting the input offset voltage of an operational amplifier.

2. Description of Related Art

As an input offset voltage is generally used for setting a static DC output voltage to zero or to a certain predetermined value, it is necessary to add the input offset voltage to the DC voltage at an input terminal. If the input stage of an operational amplifier is perfectly symmetrical and the transistor is fully compliant, then the input offset voltage will be equal to zero, but the geometric structure and doping of the chip may have discrepancies due to the change of fabrication process. Thus all operational amplifiers need a small voltage to be added between an inverting input terminal and a non-inverting input terminal to compensate for the incompliance of the chips.

In general, the input offset voltage is one of the important factors we should take into consideration for applying the characteristics of a comparator or an operational amplifier. The magnitude of the input offset voltage will affect the operating point of DC amplification and the maximum amplification factor for the application, or an error may occur after the signal is amplified. Referring to FIG. 1 showing a circuit diagram of a non-inverting amplify circuit, an operational amplifier 10 is used as an application circuit of an amplifier. If a first resistor R1 of the operational amplifier 10 is a 1 kΩ resistor and a second resistor R2 is a 99 kΩ resistor, then the amplification factor of the non-inverting amplify circuit will be equal to 100. The output Vo of the operational amplifier 10 is equal to the sum of the input voltage Vin and the input offset voltage Vio multiplied by 100 (Vo=(Vin+Vio)×100). From this formula, we know that the input voltage Vin is amplified 100 times, and the input offset voltage Vio is also amplified 100 times. Therefore, it is necessary to consider the magnitude of the input offset voltage Vio for the circuit design and try to minimize the input offset voltage Vio, so as to avoid an excessively large error of the output Vo of the operational amplifier 10 caused by an excessively high input offset voltage Vio or to avoid saturating the operational amplifier 10.

Referring to FIG. 2 showing a circuit diagram of a current detection circuit, a comparator is used as an application circuit of an operational amplifier 10. If the current I detected by the circuit falls in the range of 0 A~20 A, an analog-to-digital converter 21 will be used for reading a current signal into a micro control unit 31. Since the maximum detection current I can be up to 20 A, a 10 mΩ/5 W resistor is used as the current detection resistor R3 to lower power consumption. Therefore, the magnitude of the voltage at the current detection resistor R3 is equal to 0.2V; the voltage at the current detection resistor R3 is amplified 25 times after going through a 1 kΩ fourth resistor R4 and a 24 kΩ fifth resistor R5; and the voltage at an output terminal of the operational amplifier 10 is equal to 0~5V. However, if the input offset voltage Vio of the operational amplifier 10 is equal to ±30 mV, the error of the current of the micro control unit 31 read by the analog-to-digital converter 21 will be up to ±3 A (30 mV/10 mΩ), and the error percentage is equal to 15%. Therefore, the magnitude of the input offset voltage Vio of the operational amplifier 10 will affect the accuracy of the current read by the micro control unit 31.

In a general semiconductor fabrication process for the micro control unit, the input offset voltage of the operational amplifier is approximately equal to ±30 mV. If it is necessary to design a low input offset comparator or amplifier, a trimming method or a chopper method is generally used for the design. However, if the input offset voltage is corrected by the trimming method, the correction result only can guarantee the performance under the correct conditions, since the input offset voltage will shift with different operating voltages, operating temperatures and input voltages. If the input offset voltage is corrected by the trimming method and the operating conditions are changed, the characteristic of the operational amplifier will deteriorate and a larger error will result. If the chopper method is adopted, the circuit requires additional clock circuit and filter, thus causing a higher cost for the circuit. Furthermore, the operating bandwidth and circuit response speed cannot be enhanced to meet the requirements of the application of a high-speed comparator or amplifier.

SUMMARY OF THE INVENTION

In view of the foregoing shortcomings of the prior art, the present invention uses a micro control unit to set up a register to control the startup of a related switch circuit, such that the operational amplifier can correct and minimize the input offset voltage of an operating point and correct the input offset voltage anytime to maintain the best characteristic according to the operating conditions.

The present invention provides an input offset voltage corrector for correcting an input offset voltage of an operational amplifier, and the apparatus comprises a register unit, a micro control unit, a switch unit and an offset voltage correction unit. The register unit is used for temporarily storing an operating mode switching signal, and the micro control unit sets up the operating mode switching signal. An output terminal of the operational amplifier is connected to the micro control unit. The switch unit is installed between a signal input terminal and an operational amplifier for switching an operating mode of the input offset voltage corrector according to the operating mode switching signal. The foregoing operating mode includes a normal operating mode and an offset voltage correcting mode, and the offset voltage correcting mode further includes a positive terminal correcting mode and a negative terminal correcting mode. Each operating mode is determined by the action of each switch in the switch unit, and the action of each switch in the switch unit is operated according to the operating mode switching signal in the register unit. Finally, the offset voltage correction unit is used for correcting the input offset voltage of the operational amplifier, when the input offset voltage corrector is operated at an offset voltage correcting mode.

The input offset voltage corrector of the present invention uses a micro control unit to correct the input offset voltage anytime to improve and correct the input offset voltage by using the trimming method. Under different operating conditions, the characteristic of the operational amplifier will deteriorate, and the error will become larger. With the design of the offset voltage correction unit (which increases the number of correction bits) to minimize the input offset voltage more accurately and effectively enhance the application of the characteristic of the operational amplifier.

To make it easier for our examiner to understand the innovative features and technical content, we use a preferred embodiment together with the attached drawings for the detailed description of the present invention, but it should be pointed out that the attached drawings are provided for reference and description but not for limiting the present invention.

DETAILED DESCRIPTION OF THE PREFERRED EMBODIMENTS

Figure 1:
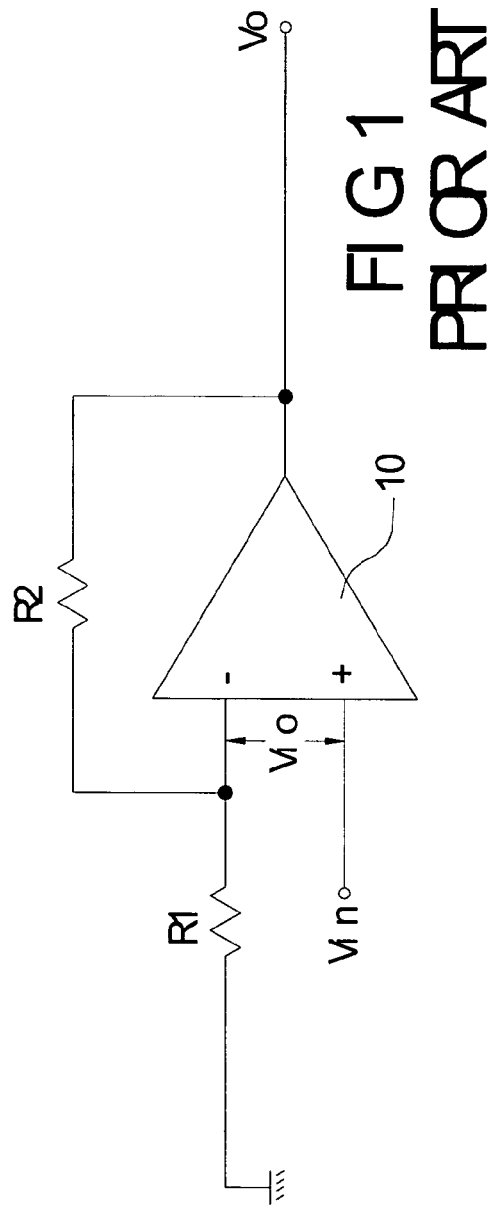
FIG. 1 is a circuit diagram of a non-inverting amplify circuit.
Figure 2:
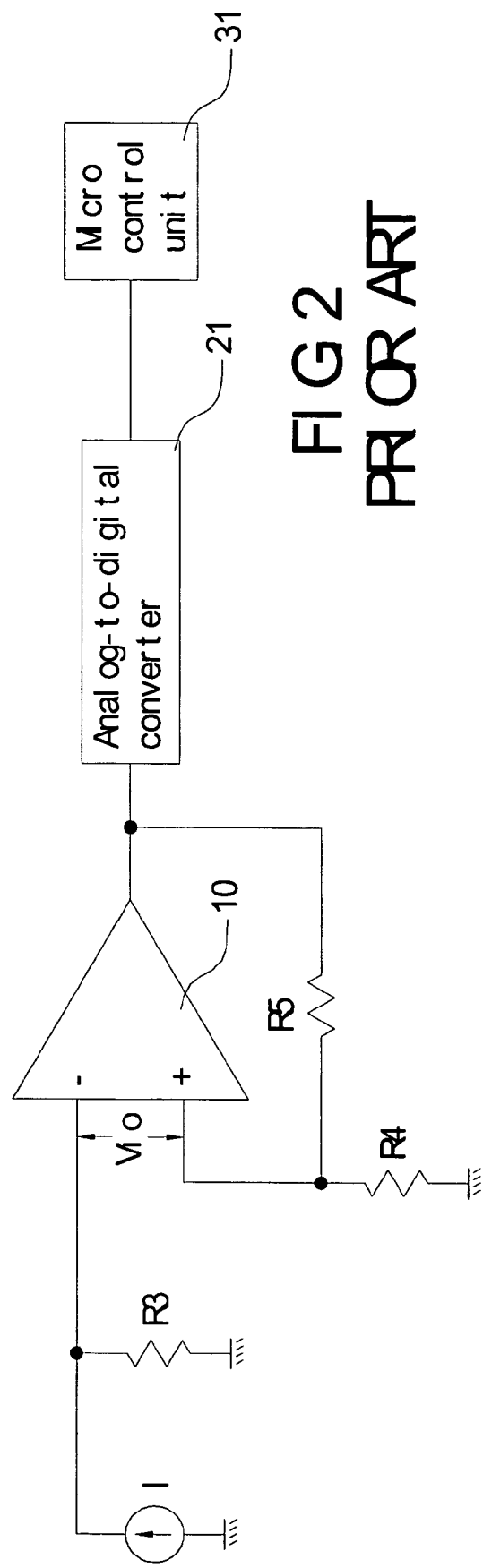
FIG. 2 is a circuit diagram of a current detection circuit.
Figure 3:
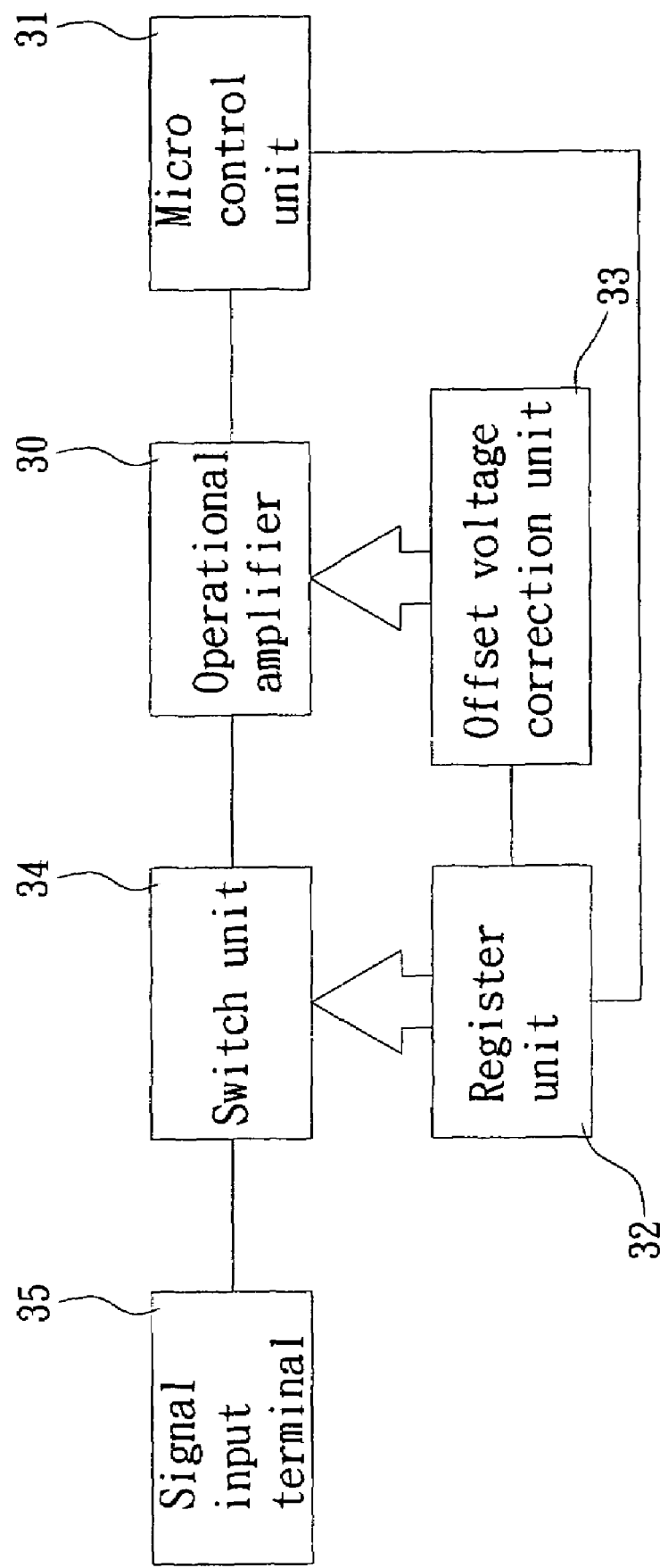
FIG. 3 is a functional block diagram of an input offset voltage corrector in accordance with the present invention.

Referring to FIG. 3 showing a functional block diagram of an input offset voltage corrector in accordance with the present invention, the input offset voltage corrector comprises a register unit 32, a micro control unit 31, a switch unit 34 and an offset voltage correction unit 33 for correcting an input offset voltage of the operational amplifier 30. The signal inputted by the signal input terminal 35 is sent to the operational amplifier 30 by the switch unit 34, and the processed signal is outputted from the operational amplifier 30 to the micro control unit 31 for the application. To overcome the influence caused by the input offset voltage of the operational amplifier 30, the micro control unit 31 sets an operating mode switching signal in the register unit 32 to control the switch unit 34 to switch the input offset voltage corrector between a normal operating mode and an offset voltage correcting mode. If the input offset voltage corrector is at an offset voltage correcting mode, then the offset voltage correction unit 33 will correct and minimize the input offset voltage of the operational amplifier 30.

Figure 3A:
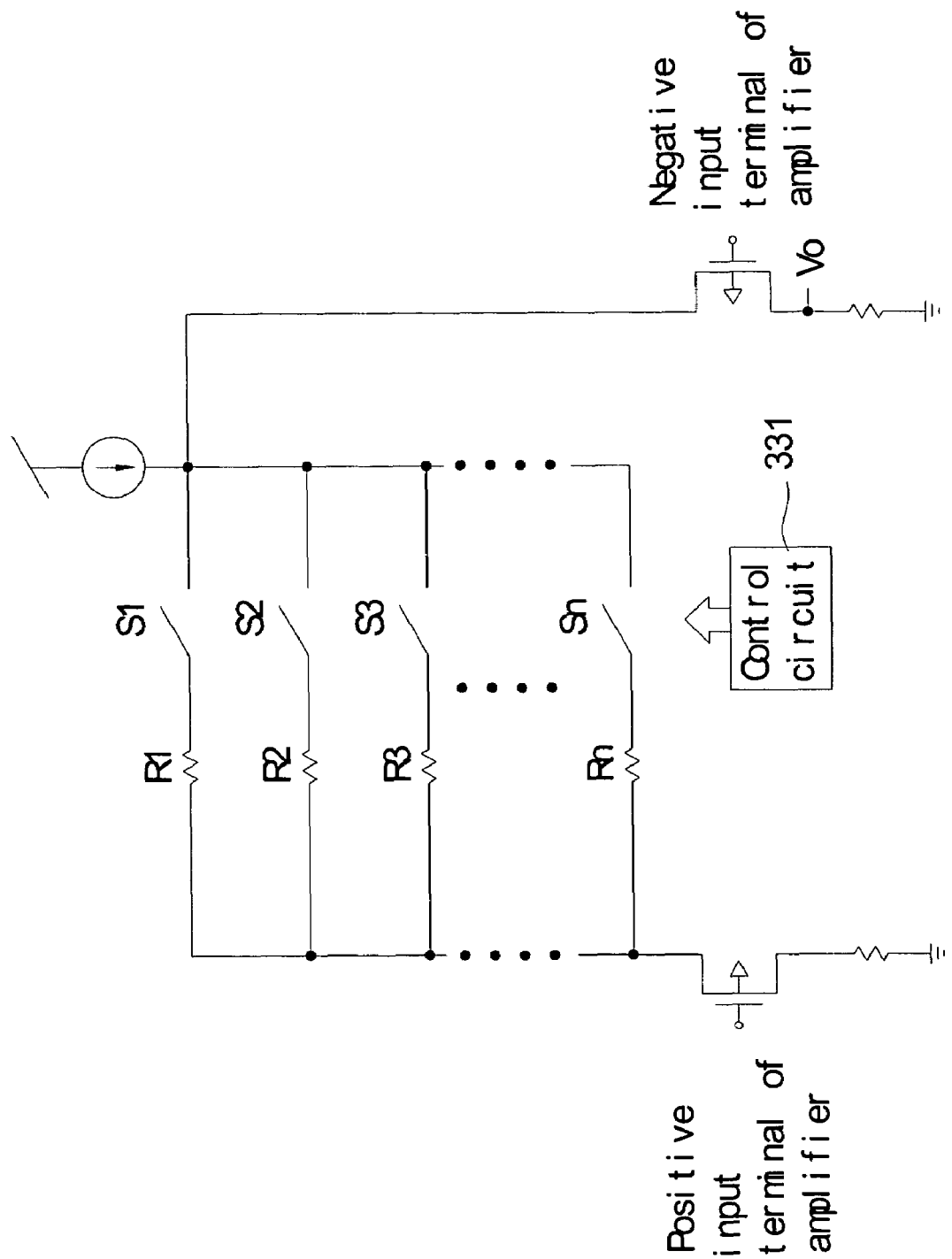
FIG. 3A is a schematic view of an offset voltage correction unit in accordance with a preferred embodiment of the present invention.

Referring to FIG. 3A showing a schematic view of an offset voltage correction unit in accordance with a preferred embodiment of the present invention, a control circuit 331 disposed between a position input terminal and a negative input terminal of the operational amplifier is used for controlling a control switch S1, S2, S3 . . . Sn to correct the input offset voltage of the operational amplifier 30 and minimize the input offset voltage.

However, the larger number of bits of the offset voltage correction unit 33, the smaller the range is for correcting the input offset voltage, and the less impact the application characteristic of the input offset voltage has upon the operational amplifier 30. Furthermore, the foregoing offset voltage correcting mode includes a positive terminal correcting mode and a negative terminal correcting mode provided for the design of the operational amplifier 30. In a switch between a positive terminal correcting mode and a negative terminal correcting mode which is similar to a switch between a normal operating mode and an offset voltage correcting mode, the micro control unit 31 sets up an operating mode switching signal in the register unit 32, and the switch unit 34 executes the corresponding switch according to the operating mode switching signal in the register unit 32, such that the input offset voltage corrector will be operated at an operating mode set by the micro control unit 31.

To prevent the correction result that can only guarantee the performance under the correct conditions, the micro control unit 31 further includes a timer module (not shown in the figure) for providing a correcting cycle, and the operating mode switching signal is set with a specific cycle in the register unit 32 to start the input offset voltage corrector at an offset voltage correcting mode and execute the input offset voltage correction.

Furthermore, the register unit 32 also can be installed in a register of the micro control unit 31 for temporarily storing an operating mode switching signal which is set by the micro control unit 31 to control the switch unit 34.

Figure 4:
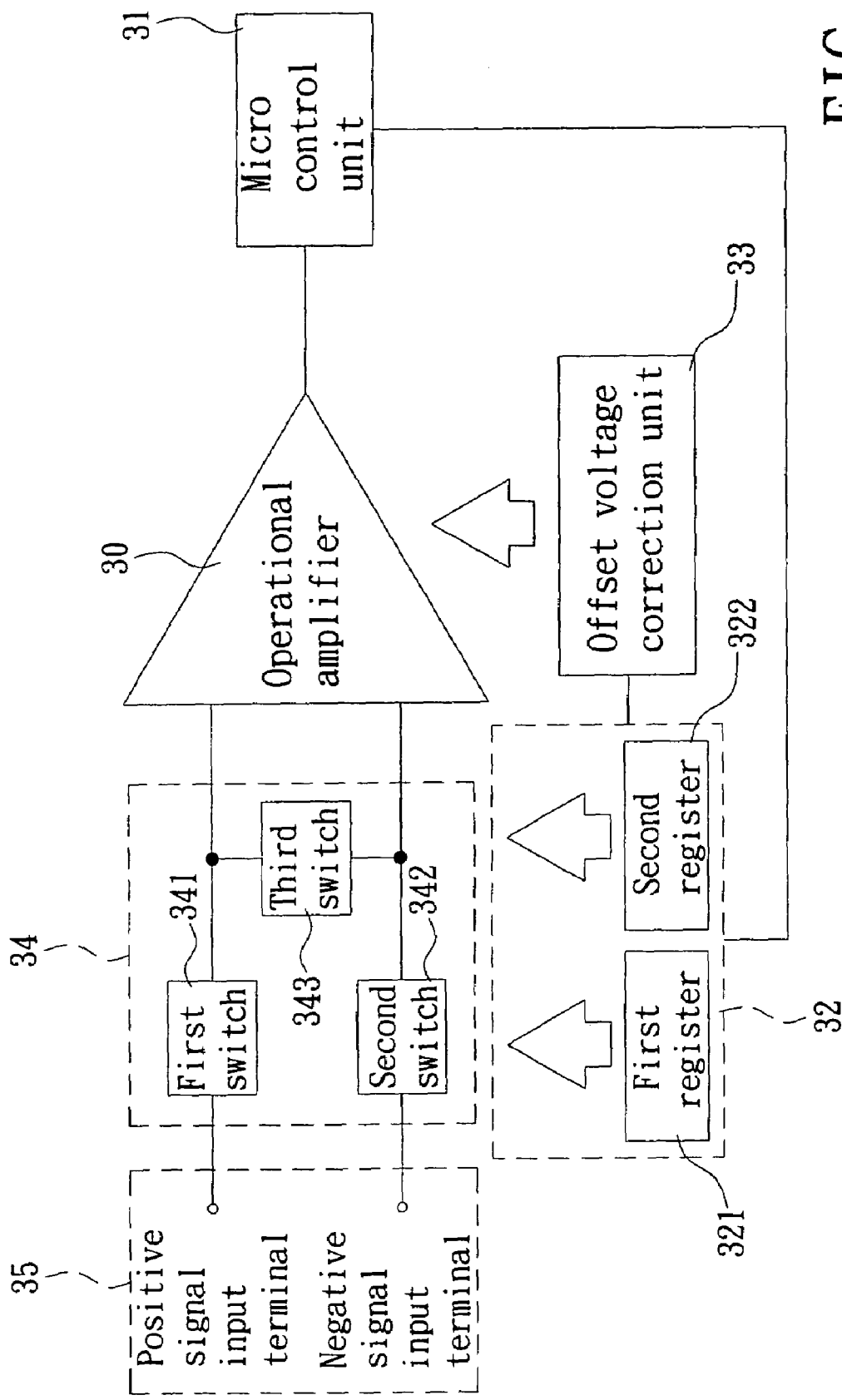
FIG. 4 is a functional block diagram of an input offset voltage corrector in accordance with a preferred embodiment of the present invention.

Referring to FIG. 4 for a functional block diagram of an input offset voltage corrector in accordance with a preferred embodiment of the present invention, the signal input terminal 35 includes a positive signal input terminal and a negative signal input terminal. The switch unit 34 includes a first switch 341, a second switch 342 and a third switch 343. The register unit 32 includes a first register 321 and a second register 322. A terminal of the first switch 341 is connected to a positive signal input terminal, and another terminal of the first switch 341 is connected to a positive terminal of the operational amplifier 30. A terminal of the second switch 342 is connected to a negative signal input terminal, and another terminal of the second switch 342 is connected to a negative terminal of the operational amplifier 30. A terminal of the third switch 343 is connected to the first switch 341 and a positive terminal of the operational amplifier 30, and another terminal of the third switch 343 is connected to the second switch 342 and a negative terminal of the operational amplifier 30.

In the foregoing description for FIG. 3, the register unit 32 temporarily stores an operating mode switching signal set by the micro control unit 31, and the operating mode switching signal includes an operating mode switching signal temporarily stored in the first register 321 for switching a normal operating mode and an offset voltage correcting mode, and an operating mode switching signal temporarily stored in the second register 322 for switching a positive terminal correcting mode and a negative terminal correcting mode. The first switch 341, second switch 342 and third switch 343 are operated according to an operating mode switching signal temporarily stored in the first register 321 and the second register 342 to start the input offset voltage corrector at a normal operating mode or an offset voltage correcting mode, or even at a positive terminal correcting mode or a negative terminal correcting mode of an offset voltage correcting mode. If the offset voltage corrector is started at the offset voltage correcting mode, the offset voltage correction unit 33 will be used for correcting the input offset voltage of the operational amplifier 30 to maintain a better application of the characteristic of the operational amplifier 30.

If each switch in the switch unit 34 sets the first switch 341 and second switch 342 to ON and the third switch 343 to OFF according to the operating mode switching signal, then the operating mode of the input offset voltage corrector will be a normal operating mode. If each switch in the switch unit 34 sets the first switch 341 and third switch 343 to ON and the second switch 342 to OFF according to the operating mode switching signal, then the operating mode of the input offset voltage corrector will be a positive terminal correcting mode. If each switch in the switch unit 34 sets the second switch 342 and third switch 343 to ON and the first switch 341 to OFF according to the operating mode switching signal, then the operating mode of the input offset voltage corrector will be a negative terminal correcting mode. A user can switch the mode which is set by the micro control unit 31 to make an appropriate correction of the input offset voltage according to the requirements of the application circuit.

Figure 5:
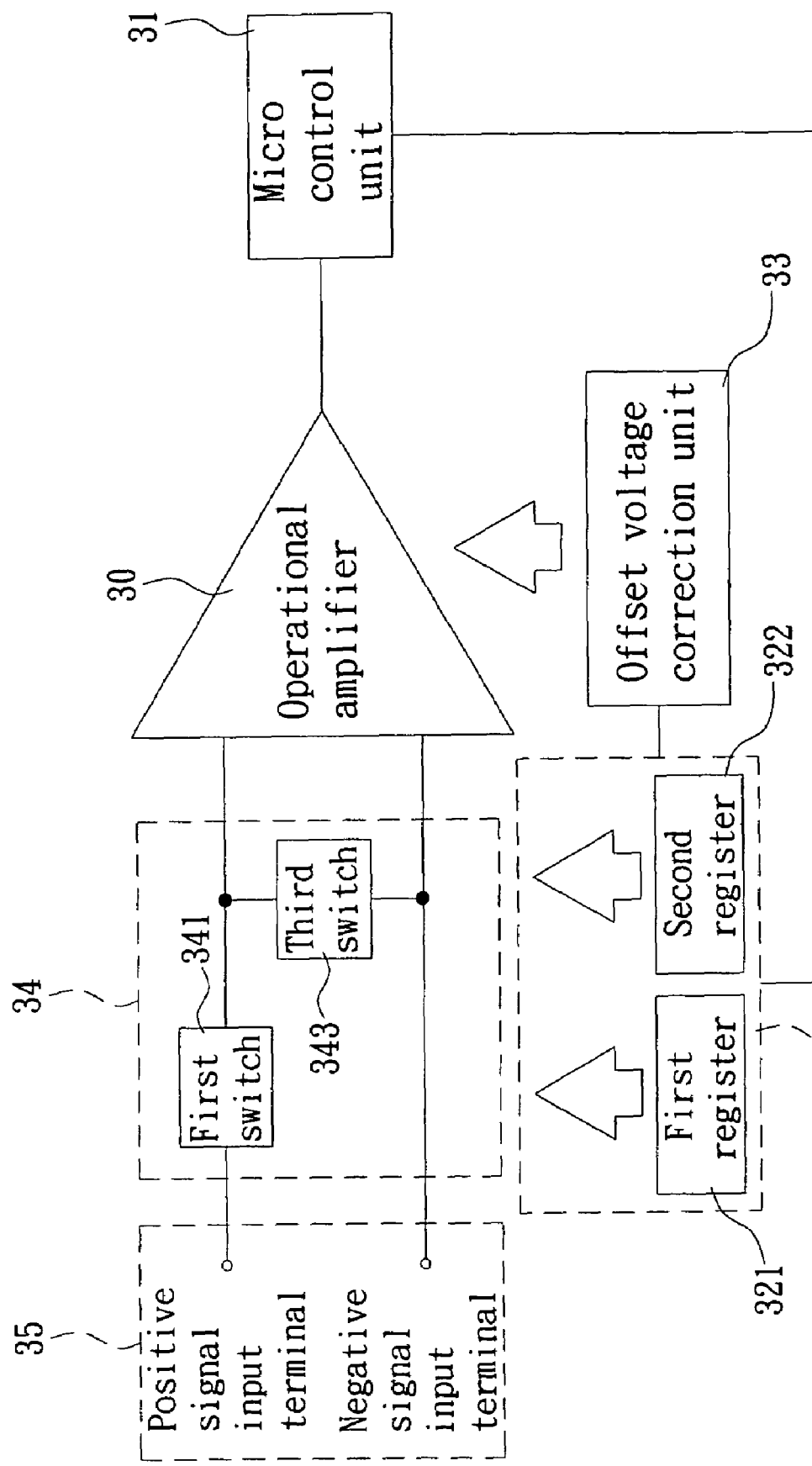
FIG. 5 is a functional block diagram of an input offset voltage corrector in accordance with a preferred embodiment of the present invention.

Referring to FIG. 5 for a functional block diagram of an input offset voltage corrector in accordance with a preferred embodiment of the present invention, the embodiment is used for the input offset voltage of the operational amplifier 30, and its correcting mode is applied for correcting the negative terminal. The related actions and principles are the same as the embodiment as shown in FIG. 4 and thus will not be described here. The method of using the switch unit 34 to switch an operating mode in accordance with this embodiment will be described as follows.

In the embodiment as shown in FIG. 5, the switch unit 34 includes a first switch 341 and a third switch 343. A terminal of the first switch 341 is connected to a positive signal input terminal, and another terminal of the first switch 341 is connected to a positive terminal of the operational amplifier 30. A terminal of the third switch 343 is connected to the first switch 341 and a positive terminal of the operational amplifier 30, and another terminal of the third switch 343 is connected to a negative signal input terminal and a negative terminal of the operational amplifier 30. The negative signal input terminal is connected directly to a negative terminal of the operational amplifier 30.

After the micro control unit 31 sets an operating mode switching signal in the register unit 32, if the first switch 341 is switched to ON and the third switch 343 is switched to OFF according to the operating mode switching signal temporarily stored in the register unit 32, the operating mode of the input offset voltage corrector will be a normal operating mode. If the first switch 341 is switched to OFF and the third switch 343 is switched to ON according to the operating mode switching signal, then the operating mode of the input offset voltage corrector will be a negative terminal correcting mode.

Therefore, the micro control unit 31 sets a signal temporarily stored in the register unit 32 to control the action of the switch unit 34, so as to switch the input offset voltage corrector between a normal operating mode and a negative terminal correcting mode.

Figure 6:
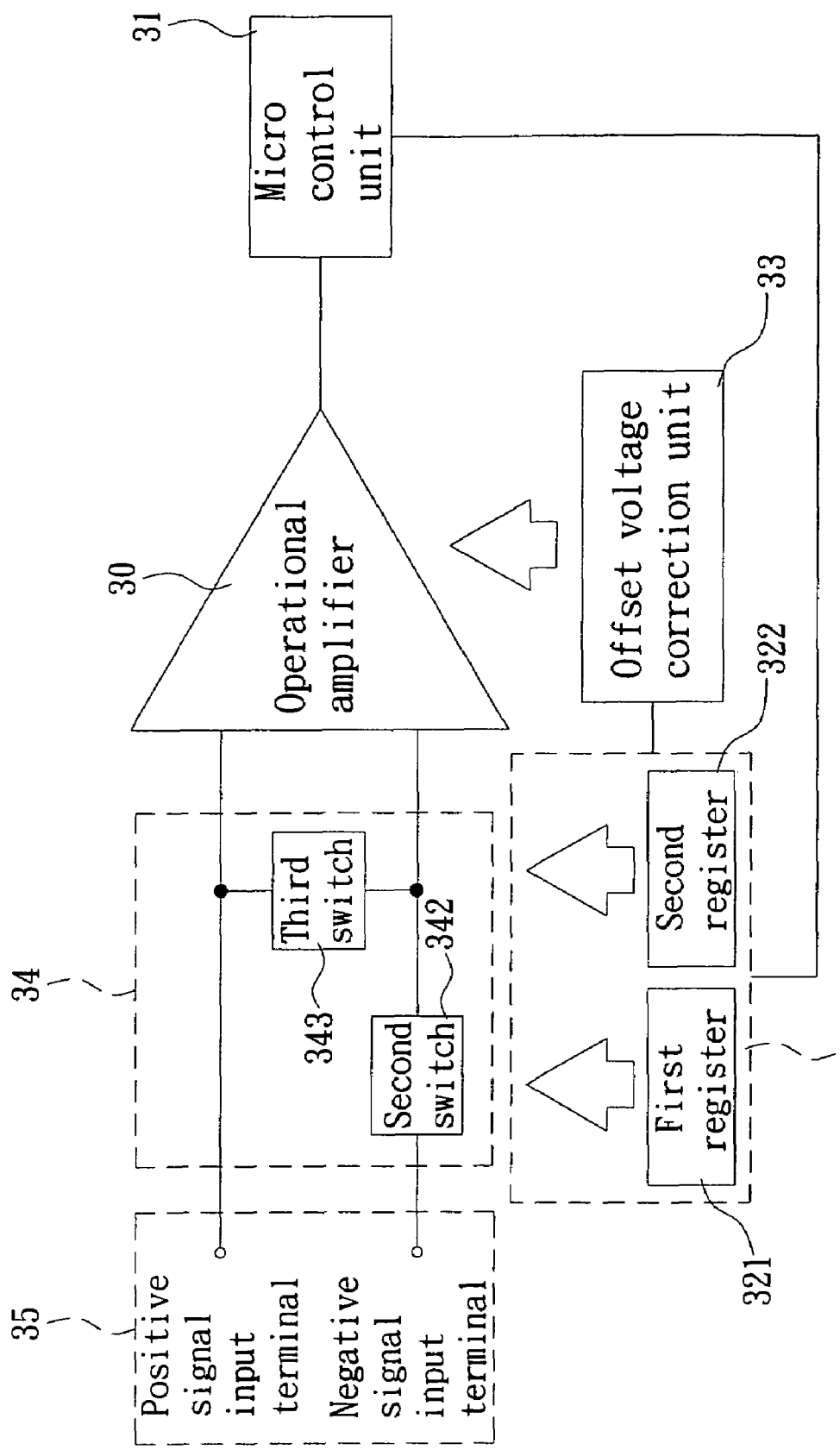
FIG. 6 is a functional block diagram of an input offset voltage corrector in accordance with a preferred embodiment of the present invention

Referring to FIG. 6 for a functional block diagram of an input offset voltage corrector in accordance with a preferred embodiment of the present invention, the embodiment is used for an input offset voltage of the operational amplifier 30, and the correcting mode is applied for correcting the positive terminal. The related actions and principles are the same as the embodiment as shown in FIG. 4 and thus will not be described here. The method of using the switch unit 34 to switch an operating mode in accordance with this embodiment will be described as follows.

In an embodiment as shown in FIG. 6, the switch unit 34 includes a second switch 342 and a third switch 343. A terminal of the second switch 342 is connected to a negative signal input terminal, and another terminal of the second switch 342 is connected to a negative terminal of the operational amplifier 30. A terminal of the third switch 343 is connected to a positive signal input terminal and a positive terminal of the operational amplifier 30, and another terminal of the third switch 343 is connected to a negative signal input terminal and a negative terminal of the operational amplifier 30. The positive signal input terminal is connected directly to a negative terminal of the operational amplifier 30.

After the micro control unit 31 sets an operating mode switching signal in the register unit 32, if the second switch 342 is set to ON and the third switch 343 is set to OFF according to an operating mode switching signal temporarily stored in the register unit 32, then the operating mode of the input offset voltage corrector will be a normal operating mode. If the second switch 342 is set to OFF and the third switch 343 is set to ON according to the operating mode switching signal, then the operating mode of the input offset voltage corrector will be a positive terminal correcting mode.

Therefore, the signal temporarily stored in the register unit 32 set by the micro control unit 31 can be used for controlling the action of the switch unit 34, so as to switch the input offset voltage corrector between a normal operating mode and a positive terminal correcting mode.

In summation of the description above, the input offset voltage corrector of the present invention can be used for correcting an input offset voltage of the operational amplifier 30 effectively, such that if the operational amplifier 30 is applied to the circuit of an amplifier or a comparator, the influence caused by the input offset voltage to the application circuit can be reduced significantly.

Although the present invention has been described with reference to the preferred embodiments thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. An input offset voltage corrector, used for correcting an input offset voltage of an operational amplifier, comprising:
   a register unit, for temporarily storing an operating mode switching signal;
   a micro control unit, coupled to an output terminal of said operational amplifier, and coupled to the register unit for setting said operating mode switching signal responsive to an amplified signal outputted from said operational amplifier;
   a switch unit, installed between a signal input terminal and said operational amplifier, according said operating mode switching signal to switch an operating mode of said input offset voltage corrector; and
   an offset voltage correction unit, coupled to the register unit for correcting an input offset voltage of said operational amplifier according to said operating mode switching signal.

2. The input offset voltage corrector of claim 1, wherein said operating mode of said input offset voltage corrector comprises a normal operating mode and an offset voltage correcting mode.

3. The input offset voltage corrector of claim 2, wherein said offset voltage correcting modes comprises a positive terminal correcting mode and a negative terminal correcting mode.

4. The input offset voltage corrector of claim 2, wherein said register unit further comprises a first register, for temporarily storing said operating mode switching signal that switches said normal operating mode and said offset voltage correcting mode.

5. The input offset voltage corrector of claim 3, wherein said register unit further comprises a second register, for temporarily storing said operating mode switching signal that switches said positive terminal correcting mode and said negative terminal correcting mode.

6. The input offset voltage corrector of claim 1, wherein said switch unit further comprises:

a first switch, coupled between a positive signal input terminal of said signal input terminal and a positive terminal of said operational amplifier; a second switch, coupled between a negative signal input terminal of said signal input terminal and a negative terminal of said operational amplifier; and a third switch, with a terminal coupled to said first switch and a positive terminal of said operational amplifier, and another terminal of said third switch coupled to said second switch and a negative terminal of said operational amplifier.

7. The input offset voltage corrector of claim 6, wherein said switch unit switches said first switch and said second switch to ON and said third switch to OFF according to said operating mode switching signal, and the operating mode of said input offset voltage corrector is a normal operating mode.

8. The input offset voltage corrector of claim 6, wherein said switch unit switches said first switch and said third switch to ON and said second switch to OFF according to said operating mode switching signal, and the operating mode of said input offset voltage corrector is a positive terminal correcting mode.

9. The input offset voltage corrector of claim 6, wherein said switch unit switches said second switch and said third switch to ON and said first switch to OFF according to said operating mode switching signal, and the operating mode of said input offset voltage corrector is a negative terminal correcting mode.

10. The input offset voltage corrector of claim 1, wherein said offset voltage correction unit is a multiple-bit offset voltage correction unit, for correcting said operational amplifier to a minimum input offset voltage.

11. The input offset voltage corrector of claim 1, wherein said switch unit further comprises:

a first switch, coupled between a positive signal input terminal of said signal input terminal and a positive terminal of said operational amplifier; and a third switch, with a terminal coupled to said first switch and a positive terminal of said operational amplifier, and another terminal of said third switch coupled to a negative signal input terminal of said signal input terminal and a negative terminal of said operational amplifier.

12. The input offset voltage corrector of claim 11, wherein said first switch is switched to ON, and said third switch is switched to OFF according to said operating mode switching signal, and the operating mode of said input offset voltage corrector is a normal operating mode.

13. The input offset voltage corrector of claim 11, wherein said first switch is switched to OFF, and said third switch is switched to ON according to said operating mode switching signal, and the operating mode of said input offset voltage corrector is a negative terminal correcting mode.

14. The input offset voltage corrector of claim 1, wherein said switch unit further comprises:

a second switch, coupled between a negative signal input terminal of said signal input terminal and a negative terminal of said operational amplifier; and a third switch, with a terminal coupled to said second switch and said negative terminal of said operational amplifier, and another terminal of said third switch coupled to a positive signal input terminal of said signal input terminal and a positive terminal of said operational amplifier.

15. The input offset voltage corrector of claim 14, wherein said second switch is switched to ON and said third switch is switched to OFF according to said operating mode switching signal, and the operating mode of said input offset voltage corrector is a normal operating mode.

16. The input offset voltage corrector of claim 14, wherein said second switch is switched to OFF and said third switch is switched to ON according to said operating mode switching signal, and the operating mode of said input offset voltage corrector is a positive terminal correcting mode.

17. The input offset voltage corrector of claim 1, wherein said register unit is installed in said micro control unit.

18. The input offset voltage corrector of claim 1, wherein said input offset voltage corrector is applied to a circuit of a comparator.

19. The input offset voltage corrector of claim 1, wherein said input offset voltage corrector is applied to a circuit of an amplifier.

* * * * *